United States Patent
Maeda et al.

(10) Patent No.: US 8,056,036 B2
(45) Date of Patent: Nov. 8, 2011

(54) SEMICONDUCTOR INTEGRATED CIRCUIT AND METHOD OF DESIGNING THEREOF BASED ON TPI

(75) Inventors: Toshiyuki Maeda, Kanagawa (JP); Toshiharu Asaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 738 days.

(21) Appl. No.: 12/153,596

(22) Filed: May 21, 2008

(65) Prior Publication Data

US 2008/0295050 A1    Nov. 27, 2008

(30) Foreign Application Priority Data

May 22, 2007   (JP) ................ 2007-135358

(51) Int. Cl.
*G06F 9/455* (2006.01)
*G06F 17/50* (2006.01)

(52) U.S. Cl. .............. 716/113; 716/111; 716/112

(58) Field of Classification Search ........... 716/111–113
See application file for complete search history.

(56) References Cited

U.S. PATENT DOCUMENTS

| | | | | |
|---|---|---|---|---|
| 5,819,072 A * | 10/1998 | Bushard et al. | ............. | 716/104 |
| 6,038,691 A * | 3/2000 | Nakao et al. | ............. | 714/733 |
| 6,247,154 B1 * | 6/2001 | Bushnell et al. | ............. | 714/733 |
| 6,256,759 B1 * | 7/2001 | Bhawmik et al. | ............. | 714/726 |
| 6,636,995 B1 * | 10/2003 | Dean et al. | ............. | 714/724 |
| 7,051,302 B2 * | 5/2006 | Xiang et al. | ............. | 716/106 |
| 2001/0021990 A1 * | 9/2001 | Takeoka et al. | ............. | 716/1 |
| 2002/0029361 A1 * | 3/2002 | Kasahara | ............. | 714/726 |
| 2007/0288822 A1 * | 12/2007 | Lin et al. | ............. | 714/741 |

FOREIGN PATENT DOCUMENTS

| | | |
|---|---|---|
| JP | 6-331709 | 12/1994 |
| JP | 9-189748 | 7/1997 |
| JP | 2006-84427 | 3/2006 |

OTHER PUBLICATIONS

S. Kajihara et al., "Aframework of High-quality Translation Fault ATPG for Scan Circuits", IEEE International Test Conference, Paper 2.1, Oct. 2006.
Y. Sato et al., "Invisible Delay Quality—SDQM Model Lights Up What Could Not Be Seen", IEEE International Test Conference, p. 47.1, Nov. 2005.

* cited by examiner

*Primary Examiner* — Jack Chiang
*Assistant Examiner* — Patrick Sandoval
(74) *Attorney, Agent, or Firm* — McGinn IP Law Group, PLLC

(57) ABSTRACT

A method of designing a semiconductor integrated circuit based on the TPI technique, comprising: (A) selecting a target node from a plurality of nodes included in a design circuit; (B) inserting a test point at the target node; (C) designating a delay time with respect to a test point path that is a path connected to the test point; and (D) laying out the design circuit such that a delay time of the test point path becomes the designated delay time. The (A) selecting includes: (A1) calculating delay times of fan-in paths and fan-out paths with respect to each of the plurality of nodes; and (A2) selecting the target node from the plurality of nodes based on the calculated delay times.

16 Claims, 10 Drawing Sheets

SEMICONDUCTOR INTEGRATED CIRCUIT AND METHOD OF DESIGNING THEREOF BASED ON TPI

BACKGROUND OF THE INVENTION

1. Field of the Invention

The present invention relates to a technique of designing a semiconductor integrated circuit. In particular, the present invention relates to a technique of designing a semiconductor integrated circuit by using a TPI (Test Point Insertion) method.

This application is based upon and claims the benefit of priority from Japanese patent application No. 2007-135358, filed on May 22, 2007, the disclosure of which is incorporated herein in its entirely by reference.

2. Description of Related Art

After a semiconductor integrated circuit is manufactured, it is necessary to conduct a test for checking whether or not defects such as a delay fault (delay defect) and a stuck-at fault occur in the product. It is therefore preferable to build a test circuit that can enhance testability of the testing into the semiconductor integrated circuit in advance during a circuit design stage. Such a design technique is called "DFT (Design For Testability)".

A "scan design" is known as one example of the DFT (refer, for example, to S. Kajihara et al., "A Framework of High-quality Transition Fault ATPG for Scan Circuits", IEEE International Test Conference, Paper 2.1, Oct. 2006). According to the scan design, all of or a part of flip-flops included in the design circuit are replaced with scan flip-flops. At the time of the test, those scan flip-flops can constitute a certain scan path. A scan test is conducted by inputting and outputting test patterns through the scan path. The test patterns are automatically generated by an ATPG (Automatic Test Pattern Generator).

A "TPI (Test Point Insertion)" is known as a method for further facilitating the test (refer, for example, to Japanese Laid-Open Patent Applications JP-Heisei-06-331709, JP-Heisei-09-189748 and JP-2006-84427). According to the TPI, a test point is inserted at a node within the design circuit in order to improve controllability and observability of signals at the time of the test.

Recently, more attention has been focused on "small delay defect" (refer, for example, to Y. Sato et al., "Invisible Delay Quality—SDQM Model Lights Up What Could Not Be Seen", IEEE International Test Conference, Page 47.1, Nov. 2005). With speeding up and increasing miniaturization of semiconductor manufacturing processes, even a small deviation from a design value in the critical path can cause the circuit to malfunction. That is to say, malfunction caused by the small delay defect has been increasing with speeding up and increasing miniaturization of the circuit. It is therefore important in delay testing to detect the small delay defects with high precision without overlooking them.

The inventors of the present application have recognized the following points.

FIG. 1 is a circuit diagram showing one example of a design circuit that is based on the scan design technique. The design circuit shown in FIG. 1 includes flip-flops (scan flip-flops) FF1 to FF4. A delay time of a path P1 from the flip-flop FF1 to the flip-flop FF3 is 6 ns. A delay time of a path P2 from the flip-flop FF1 to the flip-flop FF4 is 8 ns. A delay time of a path P3 from the flip-flop FF2 to the flip-flop FF3 is 3 ns. A delay time of a path P4 from the flip-flop FF2 to the flip-flop FF4 is 5 ns. A path with the maximum delay time among the paths P1 to P4 is the path P2, which is hereinafter referred to as a "longest path". Here, let us consider a case where a small delay defect occurs at a node TN shown in FIG. 1.

FIG. 2 shows a relationship between a path used in the delay testing and a size ($t_{defect}$) of the small delay defect to be overlooked in the delay testing. In the present example, a system clock cycle is 9 ns. Since the delay time of the longest path P2 is 8 ns, a defect of not more than 1 ns does not affect a system operation. Such a defect that does not affect the system operation is called a timing redundant defect. In a case where the path P1 is used in the delay testing, a signal is transmitted within the clock cycle (9 ns) if the size ($t_{defect}$) of a delay defect is less than 3 ns. Therefore, the delay defect is not detected but overlooked in the delay testing. More specifically, a delay defect whose size ($t_{defect}$) is from 1 ns to 3 ns is overlooked when the path P1 is used. Similarly, a delay defect whose size is from 1 ns to 4 ns is overlooked when the path P4 is used. Similarly, a delay defect whose size is from 1 ns to 6 ns is overlooked when the path P3 is used. On the other hand, a delay defect is detected precisely and the overlooking does not occur in a case where the longest path P2 is used.

As described above, it is preferable to use as long path as possible in order not to overlook the small delay defect in the delay testing. In the example shown in FIG. 1 and FIG. 2, using the longest path P2 is preferable. However, which path is used in the delay testing depends on the ATPG, and there is generally a tendency that a relatively short path is used. Therefore, the small delay defect is likely to be overlooked in the delay testing. It may be possible to modify the ATPG such that the longest path is selected in the delay testing. In this case, however, the ATPG needs to generate test patterns with searching for the longest path in order to achieve the defect detection using the longest path, and thus the time for generating the test patterns becomes much longer. Moreover, constraint on signal values for testing the longest path is increased as compared with the common ATPG, which leads to increase in the number of test patterns. These cause increase in the time and cost of the delay testing.

FIG. 3 shows one example of a design circuit that is based on the typical TPI technique. As shown in FIG. 3, a test point TP (observation flip-flop) is inserted at the node TN in the design circuit shown in FIG. 1. A path from the flip-flop FF1 to the test point TP is hereinafter referred to as a "test point path PT". The test point path PT includes the node TN, and this test point path PT is used in the delay testing.

As to the test point path PT, the setup constraint and hold constraint just need to be satisfied. Thus, the test point path PT is generally designed to be short. In many cases, the test point path PT becomes shorter than the longest path P2 according to the typical TPI technique. Therefore, the small delay defect is likely to be overlooked in the delay testing.

As described above, the small delay defect is likely to be overlooked in the delay testing, in the case of the typical TPI technique in which the path delay is not considered. The existing design technique does not support the detection of the small delay defect. If the small delay defect is overlooked during the test, a malfunction occurrence rate in the market is increased, which leads to deterioration of the product reliability.

SUMMARY

In one embodiment of the present invention, a method of designing a semiconductor integrated circuit based on a TPI technique is provided. The method includes: (A) selecting a target node from a plurality of nodes included in a design circuit; (B) inserting a test point at the target node; (C) designating a delay time with respect to a test point path that is a path connected to the test point; and (D) laying out the design circuit such that a delay time of the test point path becomes the designated delay time.

In this manner, it is possible to actively designate the delay time of the test point path. That is to say, it is possible to set the delay time of the test point path to a value enough for detecting the small delay defect. For example, the delay time of the test point path is set to be equal to a delay time of a longest path among paths passing through the target node. Consequently, the overlooking of the small delay defect can be reduced in the delay testing.

Moreover, the above-mentioned (A) step includes: (A1) calculating delay times of fan-in paths and fan-out paths with respect to each of the plurality of nodes; and (A2) selecting the target node from the plurality of nodes based on the calculated delay times. A node whose small delay defect is likely to be overlooked can be extracted based on the calculated delay times. That is to say, a node whose small delay defect is likely to be overlooked can be preferentially selected as the target node. Consequently, it is possible to reduce the number of test points to be inserted with securing sufficient test quality. In other words, it is possible to avoid unnecessary increase in the number of test points and hence to achieve an efficient test point insertion. As a result, an overhead due to the inserted test points can be reduced, and increase in the chip area and cost can be suppressed.

According to the present invention, the overlooking of the small delay defect in the delay testing is reduced. Therefore, the malfunction occurrence rate in the market is reduced, and thus the product reliability is improved. Moreover, it is possible to reduce the number of test points to be inserted. As a result, the overhead due to the inserted test points is reduced, and increase in the chip area and cost can be suppressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Design Flow

Figure 4:
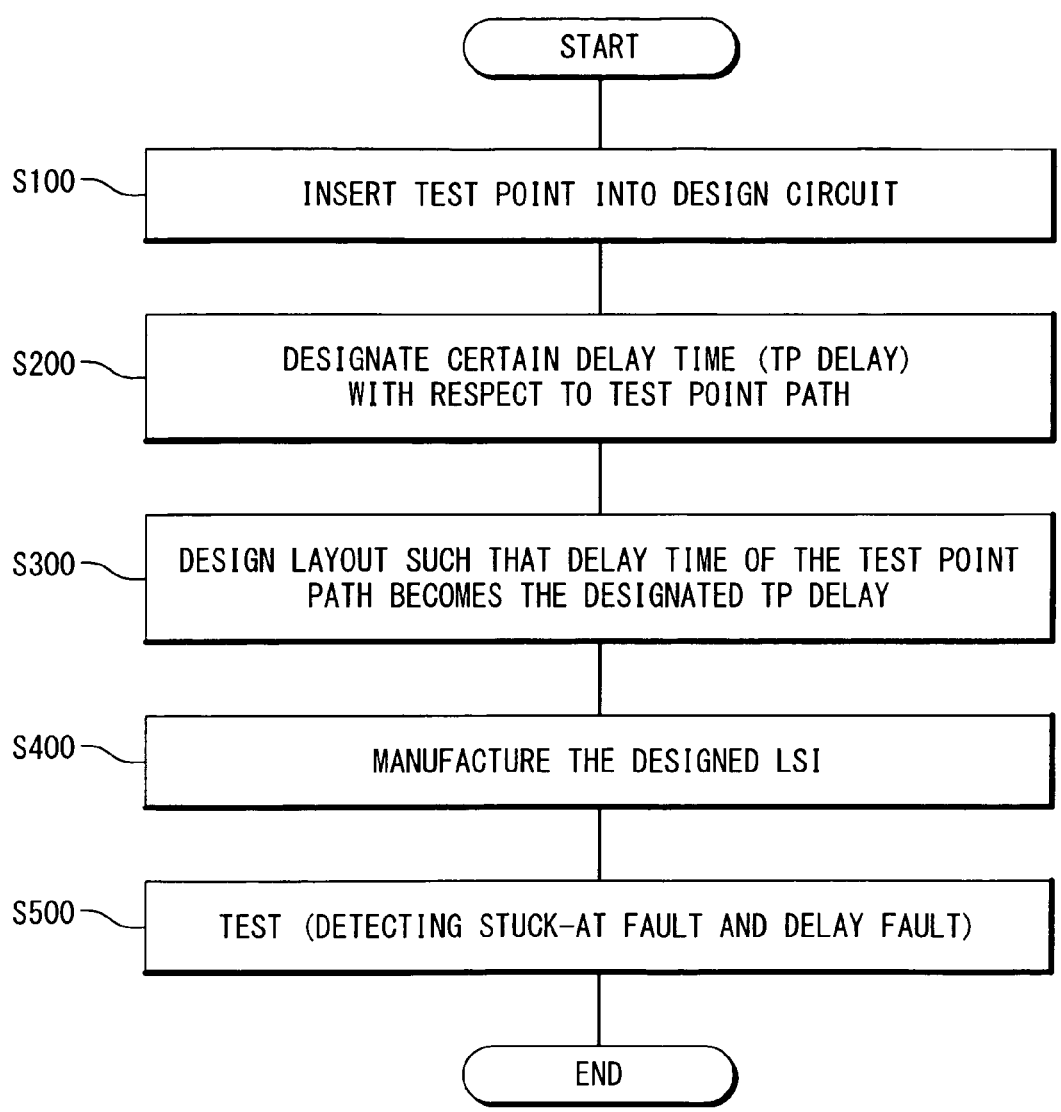
FIG. 4 is a flowchart showing a method of designing a semiconductor integrated circuit according to an embodiment of the present invention.

A method of designing a semiconductor integrated circuit according to the present embodiment is basically based on the TPI technique. It should be noted, however, that the TPI technique according to the present embodiment can support detection of the small delay defect, which is different from the conventional TPI technique. First, let us overview a method of designing a semiconductor integrated circuit according to the present embodiment with reference to a flowchart shown in FIG. 4.

Step S100:

First, test points (control test point and/or observation test point) are inserted into the design circuit (the integrated circuit under consideration). A position (node) at which a test point is to be inserted is hereinafter referred to as a "target node". How to determine the target node will be described in detail later (refer to Section 3). A signal at the target node at which the test point is inserted is externally controllable and observable. For example, a flip-flop supporting the scan test is used as the test point.

Step S200:

Next, a certain delay time is designated with respect to a path connected to the inserted test point. The path connected to the test point is a path whose starting point is a control test point or a path whose ending point is an observation test point. The path connected to the test point is hereinafter referred to as a "test point path". The delay time that is designated with respect to the test point path is hereinafter referred to as "TP delay".

Step S300:

Next, a layout process for the design circuit is performed. According to the present embodiment, the layout process for the design circuit is performed such that a delay time of the test point path becomes the above-mentioned designated TP delay. In the conventional TPI method, only the setup constraint and hold constraint are taken into consideration with regard to the test point path, and those constraints just need to be satisfied. In the present embodiment, however, the delay time of the test point path is further designated (specified) and the test point path is designed such that the designated delay time is achieved. As a result, a layout data of the design circuit in which the designated TP delay is considered is generated.

Step S400:

The semiconductor integrated circuit (designed circuit) is manufactured on the basis of the generated layout data.

Step S500:

A test of the manufactured semiconductor integrated circuit is conducted. In the test, the above-mentioned inserted test points are utilized to check whether or not defects such as delay faults and stuck-at faults are present. In particular, whether or not the small delay defect occurs in the semiconductor integrated circuit can be checked through delay testing with using the test points. In order to reduce the overlooking of the small delay defect in the delay testing, the above-mentioned "TP delay" is set as follows.

2. Test Point Dealing with Small Delay Defect

2-1. FIRST EXAMPLE

Figure 1:
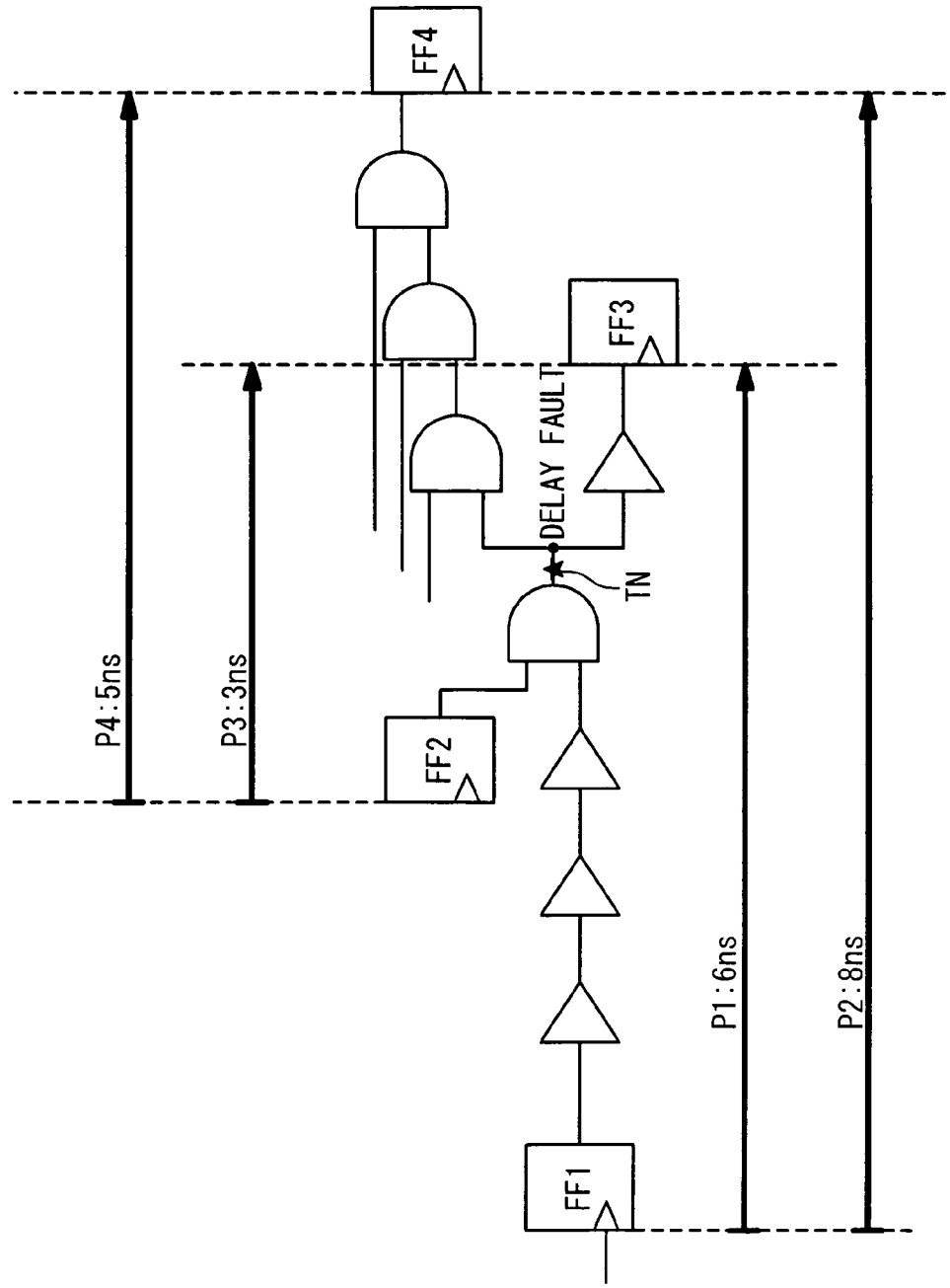
FIG. 1 is a circuit diagram showing one example of a design circuit that is based on the scan design technique.
Figure 5:
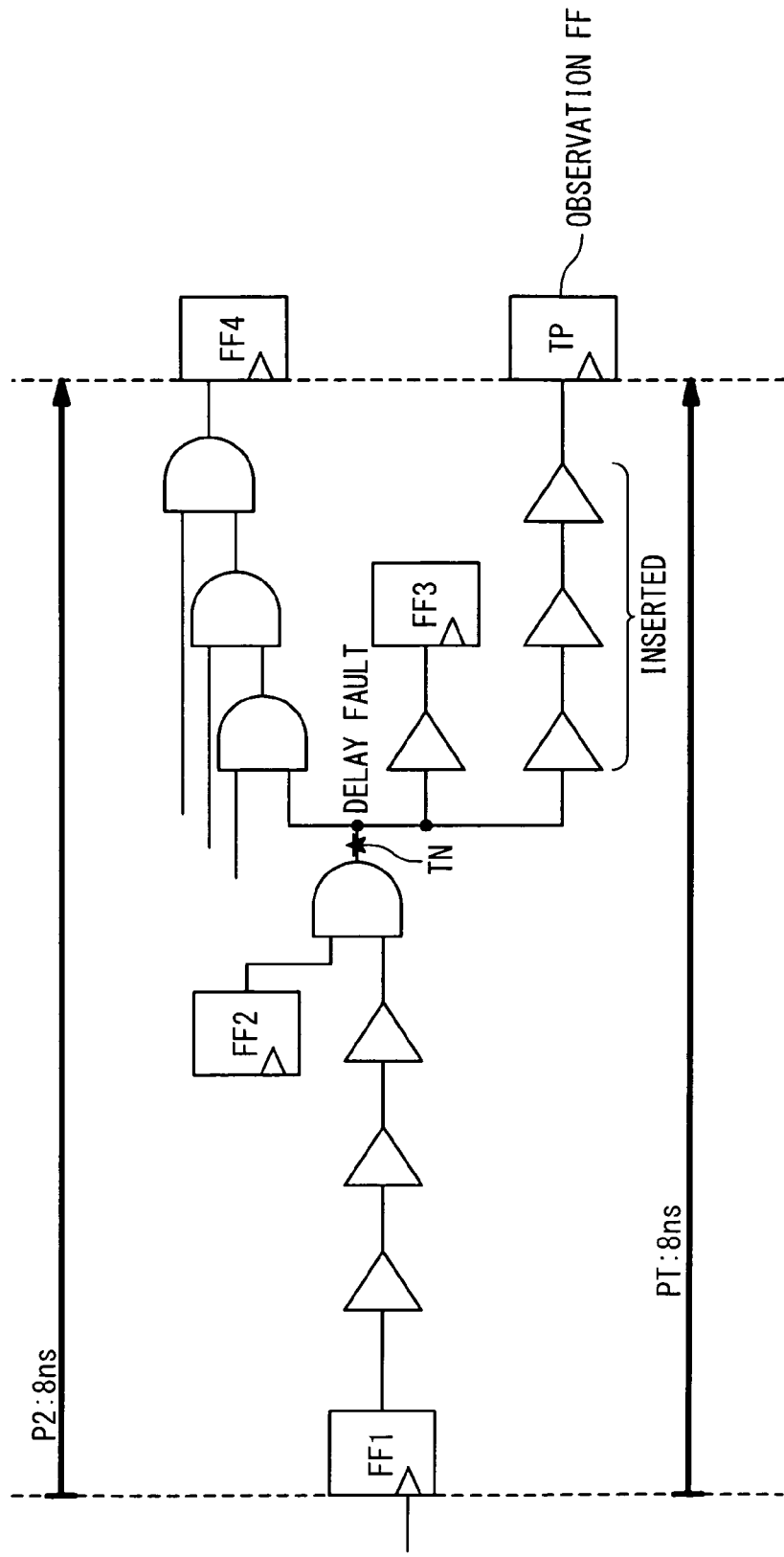
FIG. 5 is a circuit diagram showing a first example of a design circuit according to the embodiment of the present invention.

FIG. 5 shows a first example of the design circuit according to the present embodiment. The design circuit shown in FIG. 5 includes flip-flops (scan flip-flops) FF1 to FF4, as in the case shown in FIG. 1. As shown in FIG. 5, a test point TP (observation flip-flop) is inserted at a target node TN within the design circuit. A path from the flip-flop FF1 to the test point TP is the test point path PT. The longest path, whose delay time is the maximum among paths other than the test point path PT passing through the target node TN, is the path P2 (delay time: 8 ns) from the flip-flop FF1 to the flip-flop FF4.

In Step S200, a TP delay is designated with respect to the test point path PT. In the first example, the delay time (8 ns) of the longest path P2 is designated as the TP delay. In other words, the TP delay is set to be equal to the delay time of the longest path P2 that would be a preferable path used in the delay testing if the test point TP is not inserted. The TP delay is the maximum among delay times of paths passing through the target node TN. Then, in Step S300, the timing design of the test point path PT is performed such that the designated TP delay is achieved. For that purpose, some inverters as delay elements are inserted as shown in FIG. 5. As a result, the test point path PT with delay time of 8 ns is obtained.

Figure 2:
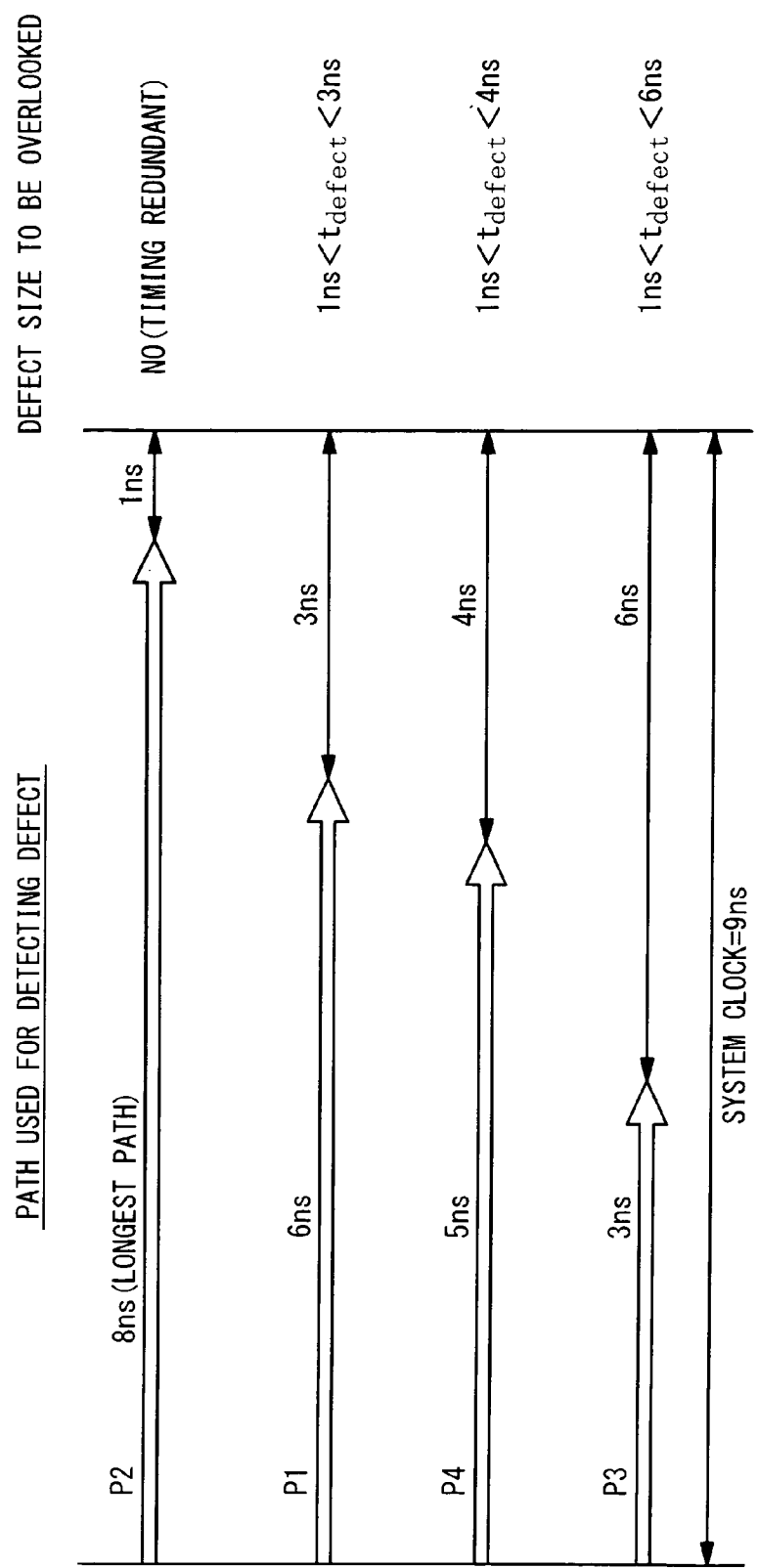
FIG. 2 is a conceptual diagram for explaining an issue dealt with in the present invention.
Figure 3:
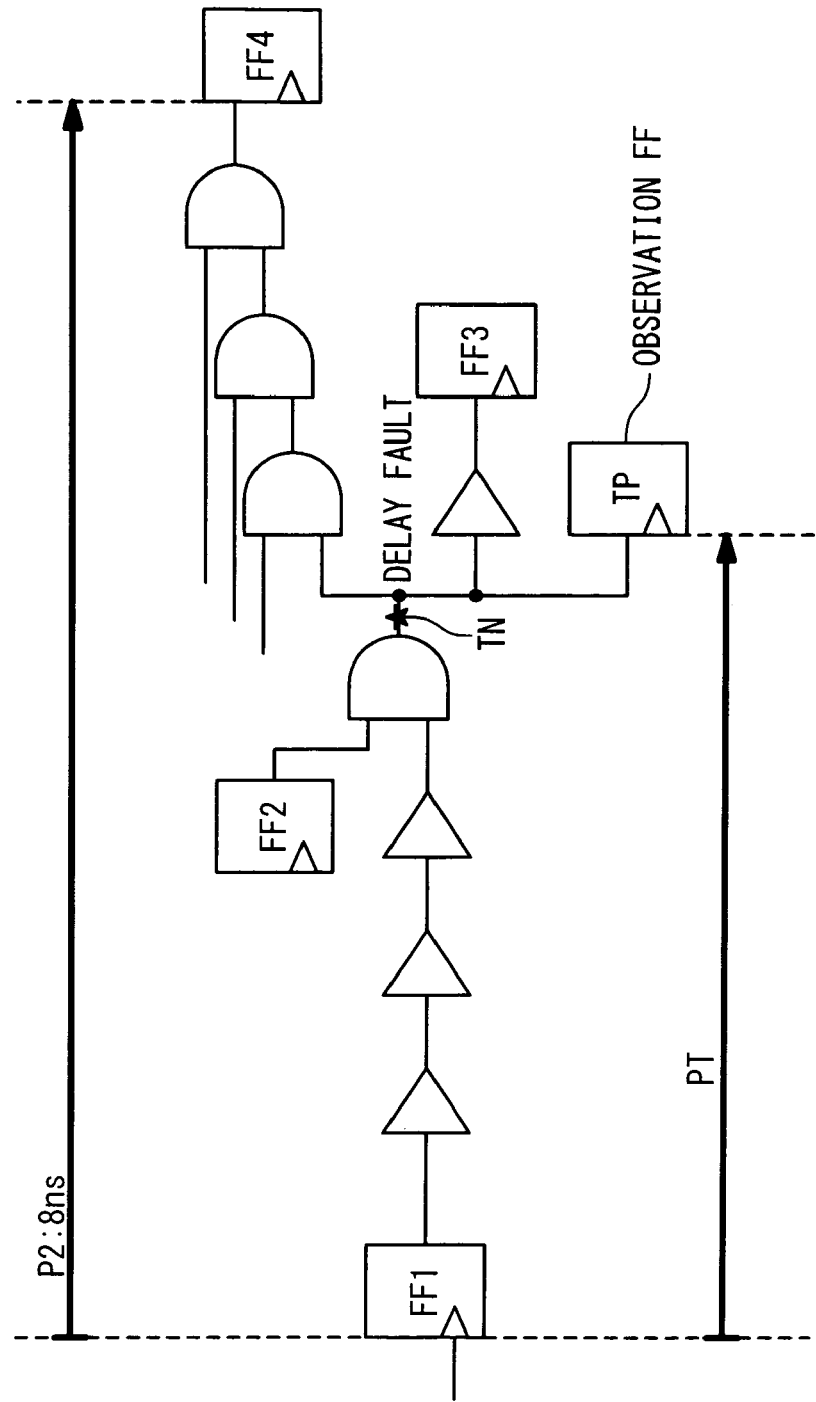
FIG. 3 is a circuit diagram showing one example of a design circuit that is based on the typical TPI technique.

In Step S400, the semiconductor integrated circuit is manufactured. Let us consider a case where a small delay defect occurs at the target node TN during the manufacturing. In Step S500, the delay testing is performed by using the test point path PT. Since the delay time of the test point path PT is 8 ns at this time, the small delay defect is not overlooked but detected precisely (see FIG. 2). In this manner, the small delay defect is not overlooked in the delay testing, even in the case of the design based on the TPI technique. Since the overlooking of the small delay defect is decreased, the malfunction occurrence rate is reduced.

2-2. SECOND EXAMPLE

Figure 6:
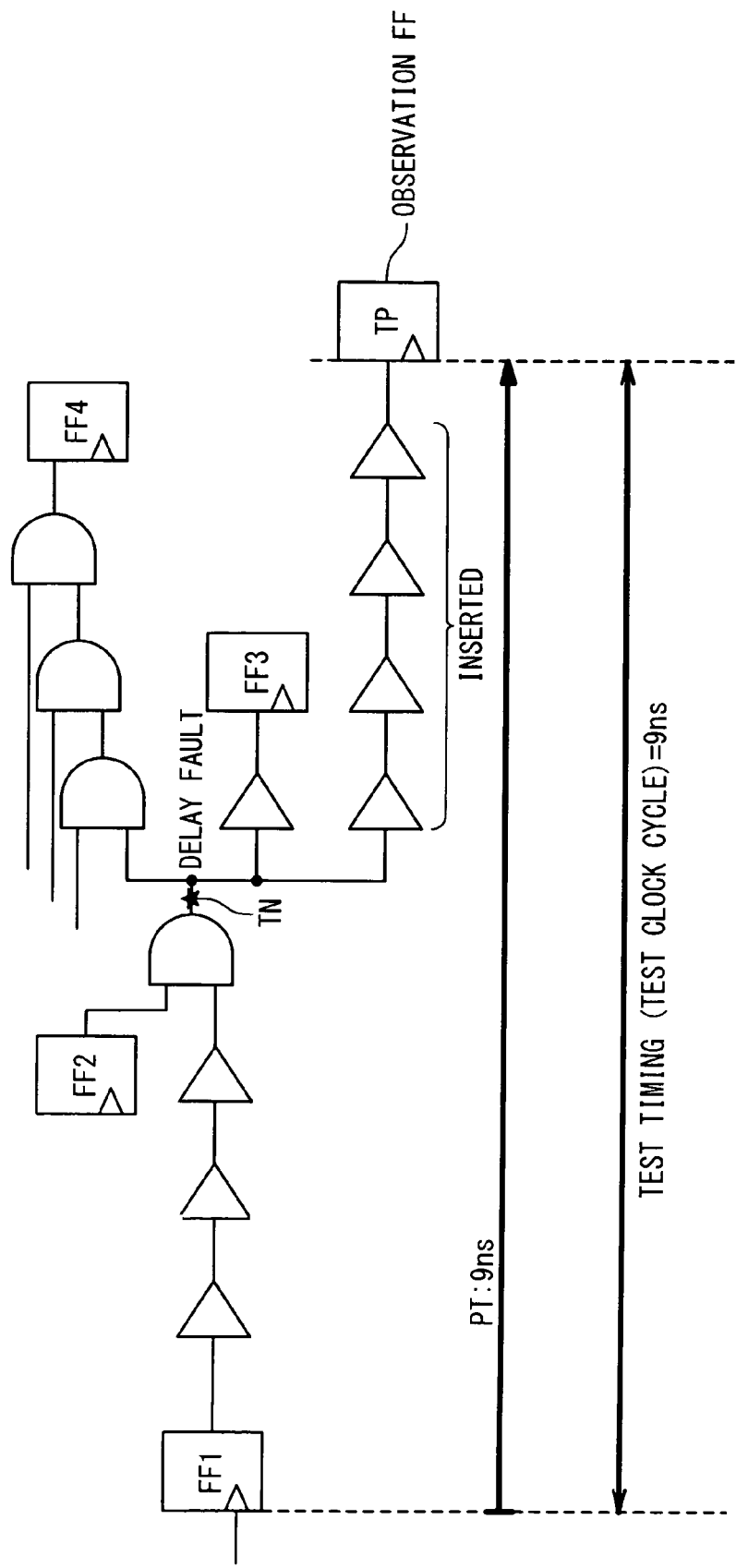
FIG. 6 is a circuit diagram showing a second example of a design circuit according to the embodiment of the present invention.

FIG. 6 shows a second example of the design circuit according to the present embodiment. The description overlapping with the first example will be omitted as appropriate. In the second example, a test clock cycle (test timing) at the time of the delay testing is designated as the TP delay. In the present example, the test clock cycle is 9 ns and thus the TP delay is set to 9 ns. The TP delay is the maximum among delay times of paths passing through the target node TN. In order that the designated TP delay is achieved, some inverters as delay elements are inserted as shown in FIG. 6. As a result, the test point path PT with delay time of 9 ns is obtained.

The test point path PT is used in the delay testing. Therefore, even if a small delay defect occurs at the target node TN, the small delay defect is not overlooked but detected precisely. That is, the same effect as in the first example can be obtained. Moreover, the detection accuracy of the small delay defect is further improved, since the TP delay in the second example is set to be larger than that in the case of the first example.

It should be noted that a certain range not more than the test clock cycle may be designated as the TP delay for the test point path PT. For example, the TP delay can be set to a range from 8 ns to 9 ns. Even in this case, the designated TP delay is the maximum among delay times of paths passing through the target node TN. Therefore, the same effect can be obtained.

2-3. THIRD EXAMPLE

Figure 7:
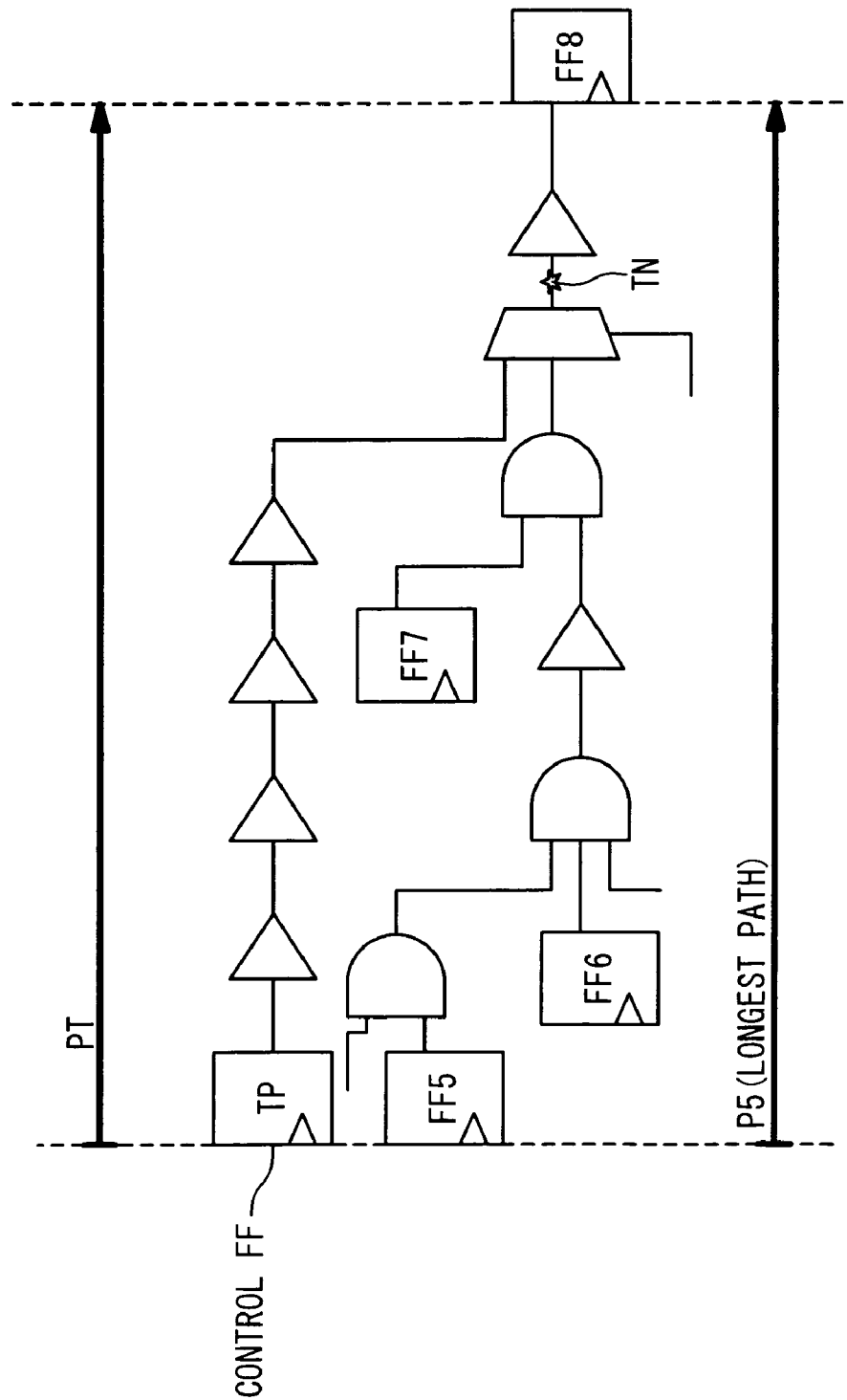
FIG. 7 is a circuit diagram showing a third example of a design circuit according to the embodiment of the present invention.

In the foregoing examples, the cases of the observation test point have been explained. The same applies to a case of a control test point. FIG. 7 shows an example of a case where a control test point is inserted. A design circuit shown in FIG. 7 includes flip-flops (scan flip-flops) FF5 to FF8. Also, a test point TP (control flip-flop) is inserted at a target node TN. A path from the test point TP to the flip-flop FF8 is the test point path PT. A certain TP delay is designated with respect to the test point path PT. For example, the TP delay is set to be equal to a delay time of the longest path P5 passing through the target node TN. Alternatively, the TP delay may be set to be equal to the test clock cycle at the time of the delay testing.

3. Method of Determining Test Point Insertion Position

As described above, the test point TP according to the present embodiment can support detection of the small delay defect. Next, a method of determining where to insert the test point TP according to the present embodiment will be described in detail. In other words, a method of determining the target node TN during the Step S100 in FIG. 4 will be described.

As the number of test points TP that are inserted is increased, the defect detection rate is improved while a chip area is increased. That is to say, when a large number of test points TP are inserted, an overhead due to the inserted test points TP becomes giant, resulting in unnecessary increase in the chip area and cost. It is therefore desirable to reduce as possible the number of test points TP to be inserted, with securing sufficient test quality.

In other words, it is desirable to "efficiently" insert the test points TP. Descried below is a method for achieving the efficient test point insertion.

Figure 8:
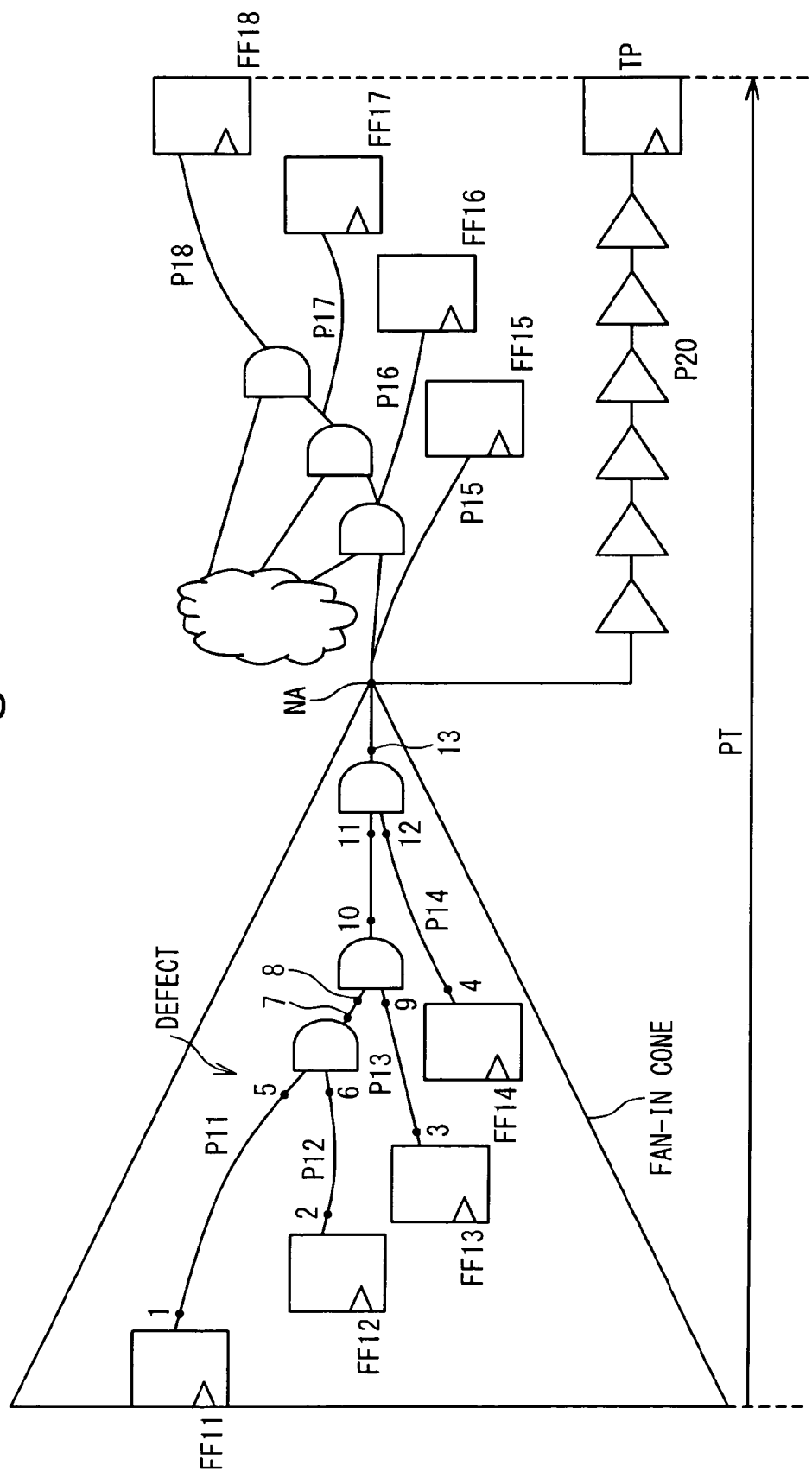
FIG. 8 is a circuit diagram for explaining a method of determining test point insertion position in the embodiment of the present invention.

FIG. 8 shows a design circuit. The design circuit includes flip-flops FF11 to FF18. Among them, the flip-flops FF11 to FF14 exist on the fan-in side of a node NA, while the flip-flops FF15 to FF18 exist on the fan-out side of the node NA. Paths from the flip-flops FF11 to FF14 on the fan-in side to the node NA are paths P11 to P14, respectively. On the other hand, paths from the node NA to the flip-flops FF15 to FF18 on the fan-out side are paths P15 to P18, respectively. Delay times of the paths P15 to P18 are different from each other. The path P15 is the shortest path on the fan-out side, while the path P18 is the longest path on the fan-out side.

Let us consider to detect a delay defect that belongs to the fan-in cone of the node NA. If no test point TP is inserted, any one of the paths P15 to P18 on the fan-out side is used in the delay testing. Which path is used depends on the ATPG. In a case where the longest path P18 is used, the small delay defect is most likely to be detected. In the other cases, however, the small delay defect is more likely to be overlooked. In particular, if the shortest path P15 is used, the small delay defect is very likely to be overlooked.

As shown in FIG. 8, an observation test point TP is inserted at the node NA. A path from the node NA to the observation test point TP is a path P20. For example, a delay time of the path P20 is set to be equal to the delay time of the longest path P18 on the fan-out side. At the time of the delay testing, the path P20 is used on the fan-out side. As a result, a small delay defect that belongs to the fan-in cone of the node NA is more likely to be detected. That is to say, the detection rate of the small delay defect is improved by the insertion of the test point TP. The degree of the improvement becomes higher as the delay time of the shortest path P15 is smaller.

Similarly, as to another node than the node NA, there exists a path whose small delay defect is likely to be overlooked. The detection rate of the small delay defect can be improved by inserting a test point TP at the node. The degree of the improvement becomes higher as the small delay defect of the node is more likely to be overlooked.

It can be said from the above that to insert a test point TP preferentially at such a node whose small delay defect is more likely to be overlooked is preferable in order to reduce as possible the number of test points TP to be inserted with securing sufficient test quality. For that purpose, a "priority parameter" is defined with respect to each node. The priority parameter represents "degree of overlooking of the small delay defect" or "degree of improvement of the defect detection rate due to the test point insertion". According to the present embodiment, a node with the larger priority parameter is "preferentially" selected as the target node TN. Consequently, it is possible to efficiently improve the detection rate of the small delay defect with a small number of test points TP.

The priority parameter is calculated for the fan-in side and the fan-out side, with respect to each of nodes included in the design circuit. In the calculation of the priority parameter, delay times of paths on the fan-in side and the fan-out side are used. Some examples of the priority parameter will be described below. In the description below, the delay time of the longest path is represented by TMAX, the delay time of the shortest path is represented by TMIN, and the test clock cycle is represented by TCLK.

<First Example of the Priority Parameter>

In a first example, the priority parameter is a difference (TMAX−TMIN) between the "delay time TMAX of the longest path" and the "delay time TMIN of the shortest path". As the difference TMAX−TMIN becomes larger, the small delay defect is more likely to be overlooked and thus the effect due to the test point insertion becomes more remarkable.

<Second Example of the Priority Parameter>

In a second example, the priority parameter is a difference (TCLK−TMIN) between the "test clock cycle TCLK" and the "delay time TMIN of the shortest path". As the difference TCLK−TMIN becomes larger, the small delay defect is more likely to be overlooked and thus the effect due to the test point insertion becomes more remarkable.

<Third Example of the Priority Parameter>

In a third example, the priority parameter is an inverse number (1/TMIN) of the delay time TMIN of the shortest path. The larger the inverse number 1/TMIN is, the smaller the delay time TMIN is. As the inverse number 1/TMIN becomes larger, the small delay defect is more likely to be overlooked and thus the effect due to the test point insertion becomes more remarkable.

<Fourth Example of the Priority Parameter>

In a fourth example, an assumed defect number, namely, the number of delay defects that can be verified by using the test point TP is considered. In FIG. 8, for example, delay defects that belong to the fan-in cone of the node NA can be verified by using the observation test point TP. As shown in FIG. 8, the assumed defect number is 13 (note that defects are defined at an input and an output of each element). As the assumed defect number is larger, influence of the insertion of one test point TP becomes more remarkable. Therefore, the degree of improvement of the detection rate becomes more precise by multiplying the assumed defect number by the value that is calculated in any of the above-mentioned first to third examples. The priority parameter in the present example is a product of the assumed defect number and any value (TMAX−TMIN or TCLK−TMIN or 1/TMIN) calculated in the foregoing examples.

<Fifth Example of the Priority Parameter>

In a fifth example, the priority parameter is an improvement factor of SDQL (Statistical Delay Quality Level) due to the test point insertion. The SDQL is an index that represents quality of the delay testing in which delay time of test path is considered (refer to the above-mentioned documents: S. Kajihara et al., "A Framework of High-quality Transition Fault ATPG for Scan Circuits", IEEE International Test Conference, Paper 2.1, Oct. 2006; and Y. Sato et al., "Invisible Delay Quality—SDQM Model Lights Up What Could Not Be Seen", IEEE International Test Conference, Page 47.1, Nov. 2005). Supposing that a test point TP is inserted at a certain node, the improvement factor (improvement degree) of the SDQL with regard to the certain node is used as the priority parameter. More specifically, with regard to the design circuit before the insertion of the test point TP, the worst value of the SDQL, namely, the SDQL in a case when the delay testing is performed by using the shortest path (minimum delay path) is first calculated. The worst value of the SDQL is calculated with respect to each node. The improvement factor of the SDQL of a node is calculated by assuming that a test point TP is inserted at the node and a defect at the node is detected by using a path including the test point TP. The improvement factor of the SDQL is calculated with respect to each node. The calculated improvement factor is the priority parameter of each node.

Figure 9:
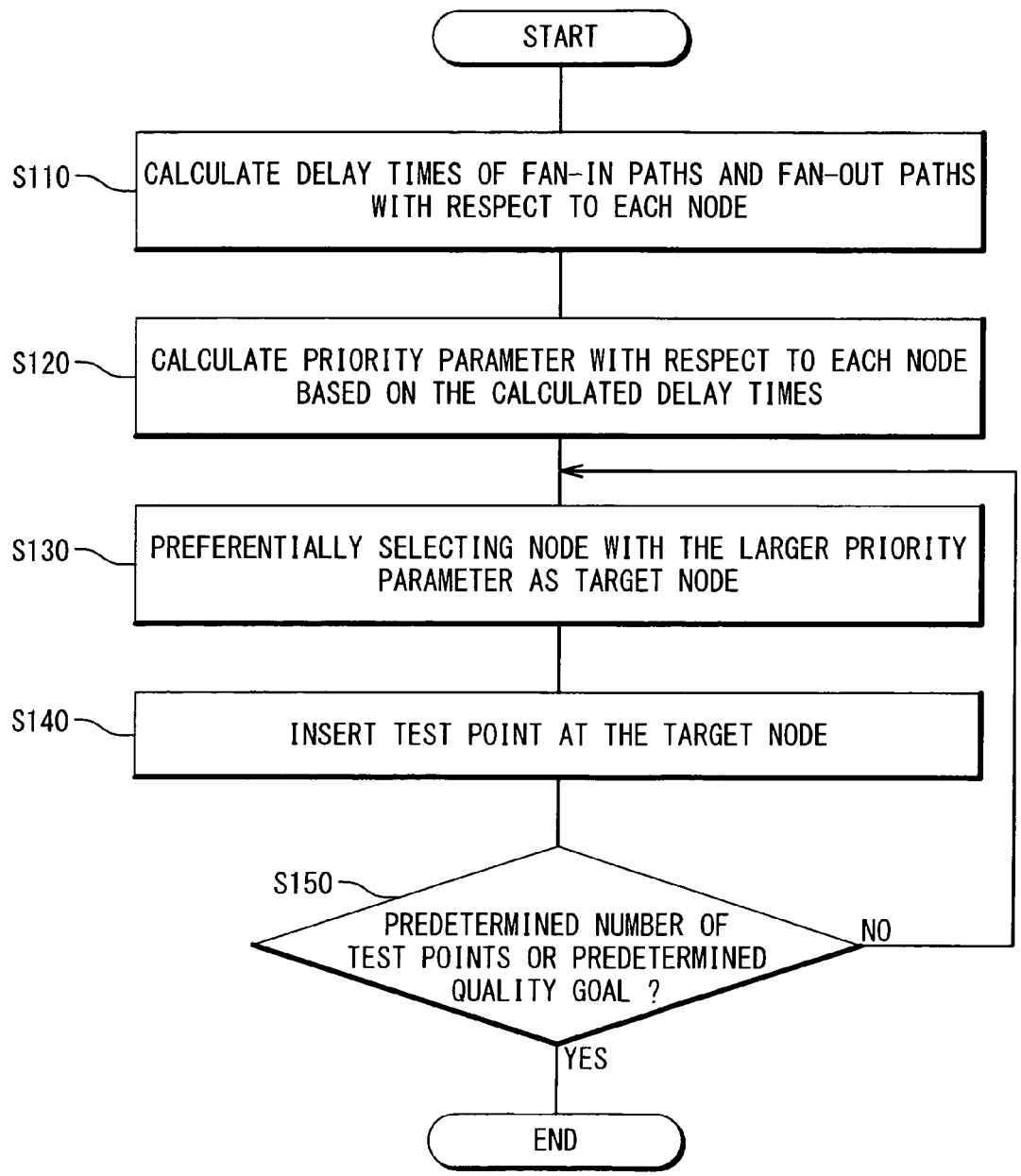
FIG. 9 is a flowchart showing a method of inserting test points according to the embodiment of the present invention.

FIG. 9 is a flowchart schematically showing the test point insertion process (Step S100) according to the present embodiment. First, in Step S110, delay times of the fan-in paths and the fan-out paths are calculated with respect to each node (position at which a test point can be inserted). Next, the above-described "priority parameter" is calculated based on the calculated delay times (Step S120). The priority parameter is calculated for the fan-in side and the fan-out side with respect to each node.

Next, a node with the larger priority parameter is preferentially selected as the target node TN at which the test point TP is to be inserted (Step S130). More specifically, the priority parameters of respective nodes are compared with each other. Then, a node is selected as the target node TN in descending order of the priority parameter. For example, a target node TN at which an observation test point is to be inserted can be selected by comparing the respective priority parameters on the fan-out side. On the other hand, a target node TN at which a control test point is to be inserted can be selected by comparing the respective priority parameters on the fan-in side. Alternatively, a target node TN at which a control test point or an observation test point is to be inserted may be selected by collectively comparing the priority parameters on both of the fan-in side and the fan-out side.

Next, a test point TP is inserted at the selected target node TN (Step S140). If the target node TN has been selected based on the priority parameters on the fan-in side, a control test point is inserted. On the other hand, if the target node TN has been selected based on the priority parameters on the fan-out side, an observation test point is inserted.

If the number of inserted test points TP does not reach a predetermined number or if test quality does not reach a predetermined goal (Step S150; No), the processing returns back to Step S130. Then, a node with the next largest priority parameter is selected as another target node TN. If the number of inserted test points TP reaches the predetermined number or if the test quality reaches the predetermined goal (Step S150; Yes), the processing is completed. The test quality here is the improvement factor of the SDQL, for example.

According to the method described above, it is possible to reduce the number of test points to be inserted with securing sufficient test quality. In other words, it is possible to avoid unnecessary increase in the number of test points TP and hence to achieve the efficient test point insertion. As a result, the overhead due to the inserted test points TP can be reduced, and increase in the chip area and cost can be suppressed.

4. Design System and Design Program

Figure 10:
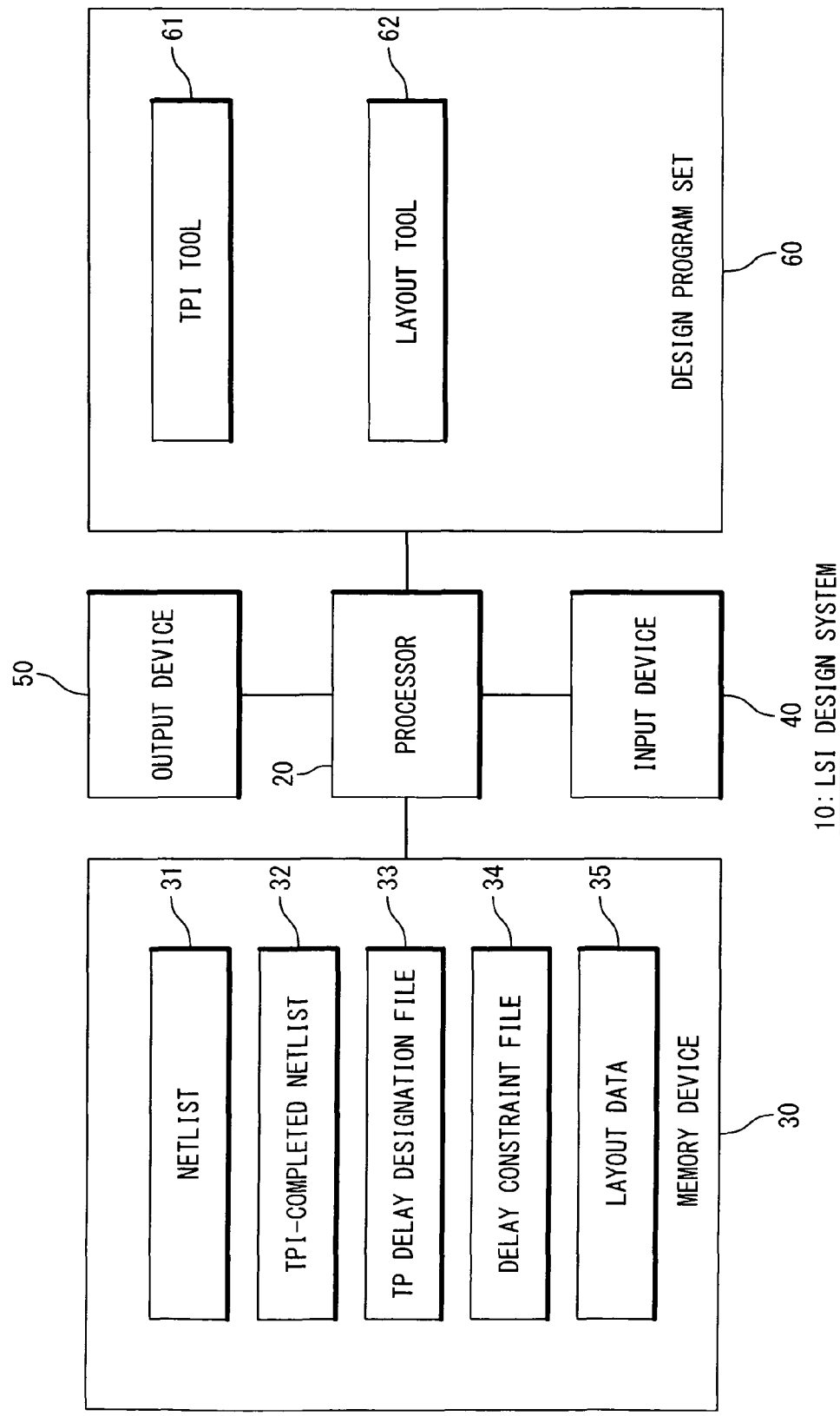
FIG. 10 is a block diagram showing a configuration example of an LSI design system according the embodiment of the present invention.

The design processing according to the present embodiment can be achieved by a computer system. FIG. 10 is a block diagram showing a configuration example of an LSI design system 10 that is realized by a computer. The LSI design system 10 is provided with a processor 20, a memory device 30, an input device 40, an output device 50 and a design program set 60. The memory device 30 includes a RAM and a HDD. The input device 40 includes a key board and a mouse. The output device 50 includes a display.

Stored in the memory device 30 are a netlist 31, a TPI-completed netlist 32, a TP delay designation file 33, a delay constraint file 34, a layout data 35 and so on.

The design program set 60 is recorded on a computer-readable recording medium. The design program set 60 includes a TPI tool 61 and a layout tool 62. These tools are software that are read and executed by the processor 20. The processor 20 executes the software to achieve the design processing according to the present embodiment. The processor 20 reads out necessary data and files from the memory device 30, and stores generated data and files in the memory device 30.

The TPI tool 61 performs the insertion of the test point TP (Step S100). More specifically, the TPI tool 61 reads the netlist 31, and selects the target node TN from nodes included in the design circuit indicated by the netlist 31 in accordance with the above-described method. Then, the TPI tool 61 inserts the test point TP at the selected target node TN. As a result, the TPI-completed netlist 32 in which the test point TP is inserted is generated.

Information on the designation of the TP delay is described in the TP delay designation file 33. For example, to designate the test clock cycle as the TP delay is described. The TP delay designation file 33 is generated based on design strategy and is described in a format which can be interpreted by the layout tool 62 (Step S200). The delay constraint file 34 is a file indicating usual delay constraint (setup constraint, hold constraint) on a user circuit section, namely, delay constraint other than the TP delay.

The layout tool 62 reads the TPI-completed netlist 32, TP delay designation file 33 and delay constraint file 34, and lays out the design circuit based on the read data (Step S300). More specifically, the layout tool 62 performs the layout design and timing design of the user circuit section such that the delay constraint indicated by the delay constraint file 34 is satisfied. As to the test point path PT, the layout design and timing design are performed such that the delay time of the test point path PT becomes the TP delay specified by the TP delay designation file 33. It should be noted that priority of the timing design is higher in the user circuit section than in the test point path PT. In this manner, the layout data 35 indicating the layout of the design circuit is generated.

5. Brief Summary

As described above, the present embodiment provides a method of designing a semiconductor integrated circuit based on the TPI technique. By using the test point TP, the test can be easily conducted. The number of test patterns is reduced. Moreover, it is not necessary to greatly modify the timing design of a user circuit section, since what affects the design of the user circuit section is just a section into which the test point TP is inserted.

Moreover, according to the present embodiment, it is possible to actively designate an arbitrary TP delay with respect to the test point path PT, which is different from the conventional TPI method. That is to say, it is possible to set the delay time of the test point path PT to a value enough for detecting the small delay defect. Consequently, the overlooking of the small delay defect in the delay testing is remarkably reduced. Therefore, the malfunction occurrence rate in the market is reduced, and thus the product reliability is improved. It can be said that the present embodiment can enhance detection accuracy of the small delay defect while taking advantages of the typical TPI method. Moreover, the time for generating the test patterns by the ATPG can be reduced, since the detection of the small delay defect becomes easier. Also, the number of test patterns is reduced and hence the test time can be reduced.

Furthermore, according to the present embodiment, it is possible to reduce the number of test points to be inserted with securing sufficient test quality. In other words, it is possible to avoid unnecessary increase in the number of test points TP and hence to achieve the efficient test point insertion. As a result, the overhead due to the inserted test points TP can be reduced, and increase in the chip area and cost can be suppressed.

It is apparent that the present invention is not limited to the above embodiments and may be modified and changed without departing from the scope and spirit of the invention.

What is claimed is:

1. A method of designing a semiconductor integrated circuit based on a test point insertion technique, said method comprising:
    selecting a target node from a plurality of nodes included in a design circuit, as executed by a processing unit on a computer;
    inserting a test point at said target node;
    designating a delay time with respect to a test point path that includes a path connected to said test point; and
    laying out said design circuit such that a delay time of said test point path becomes said designated delay time,
    wherein said selecting the target node comprises:
        calculating delay times of fan-in paths and fan-out paths with respect to each of said plurality of nodes; and
        selecting said target node from said plurality of nodes based on said calculated delay times,
    wherein said selecting said target node from said plurality of nodes based on said calculated delay times comprises:
        calculating a priority parameter with respect to each of said plurality of nodes, said priority parameter depending on a minimum value of said calculated delay times;
        wherein said priority parameter is a difference between a maximum value and a minimum value of said calculated delay times.

2. The method according to claim 1, wherein said priority parameter is a difference between a test clock cycle and a minimum value of said calculated delay times.

3. The method according to claim 1, wherein said priority parameter is an inverse number of a minimum value of said calculated delay times.

4. The method according to claim 1, wherein said priority parameter is a product of a difference between a maximum value and a minimum value of said calculated delay times and a number of delay defects to be verified by using said test point.

5. The method according to claim 1, wherein said selecting said target node from said plurality of nodes based on said calculated delay times comprises:
 calculating a value for SDQL (Statistical Delay Quality Level) when a test is performed by using a minimum delay path, with respect to each of said plurality of nodes;
 calculating a priority parameter with respect to each of said plurality of nodes, wherein said priority parameter is an improvement factor of said value for SDQL in a case when said test point is inserted; and
 preferentially selecting a node with the larger priority parameter as said target node.

6. The method according to claim 1, wherein in said designating the delay time, a delay time of said test point path is designated as to be maximum among delay times of paths passing through said target node.

7. The method according to claim 6, wherein a maximum one of delay times of paths other than said test point path passing through said target node is designated as a delay time of said test point path.

8. The method according to claim 1, wherein the path connected to said test point includes a path whose starting point includes a control test point.

9. The method according to claim 1, wherein the path connected to said test point includes a path whose ending point includes an observation test point.

10. The method according to claim 1, wherein said test point path is designed such that the designated delay time is achieved.

11. The method according to claim 1, wherein the priority parameter is calculated for the fan-in paths and the fan-out paths with respect to each of said plurality of nodes.

12. The method according to claim 1, wherein if said target node is selected based on the priority parameter on the fan-in paths, a control test point is inserted.

13. The method according to claim 1, wherein if said target node is selected based on the priority parameter on the fan-out paths, an observation test point is inserted.

14. The method according to claim 1, wherein said target node at which a control test point or an observation test point is to be inserted is selected by collectively comparing priority parameters on the fan-in paths and the fan-out paths.

15. The method according to claim 1, wherein the delay time of the test point path is set to be equal to a delay time of a longest path among paths passing through said target node.

16. A design program recorded on a non-transitory computer-readable medium that, when executed, causes a computer to perform a method of designing a semiconductor integrated circuit based on a test point insertion technique, said method comprising:
 selecting a target node from a plurality of nodes included in a design circuit;
 inserting a test point at said target node;
 designating a delay time with respect to a test point path that is a path connected to said test point; and
 laying out said design circuit such that a delay time of said test point path becomes said designated delay time,
 wherein said selecting the target node comprises:
  calculating delay times of fan-in paths and fan-out paths with respect to each of said plurality of nodes; and
  selecting said target node from said plurality of nodes based on said calculated delay times,
 wherein said selecting said target node from said plurality of nodes based on said calculated delay times comprises:
 calculating a priority parameter with respect to each of said plurality of nodes, said priority parameter depending on a minimum value of said calculated delay times;
 wherein said priority parameter is a difference between a maximum value and a minimum value of said calculated delay times.

* * * * *